United States Patent [19]

Berry

[11] Patent Number: 4,625,201
[45] Date of Patent: Nov. 25, 1986

[54] EMERGENCY BATTERY CELL MONITOR

[76] Inventor: Robert J. Berry, 14 Friar Rd., Morris Plains, N.J. 07950

[21] Appl. No.: 653,894

[22] Filed: Sep. 24, 1984

[51] Int. Cl.$^4$ .............................................. G08B 21/00
[52] U.S. Cl. ...................................... 340/636; 73/291; 320/48; 324/435; 340/59
[58] Field of Search .................. 340/636, 59; 73/32 R, 73/291; 204/129, 292, 293; 324/432, 435; 320/48

[56] References Cited

U.S. PATENT DOCUMENTS

| | | | |
|---|---|---|---|
| 1,338,170 | 4/1920 | Carlon | 320/48 X |
| 1,818,185 | 8/1931 | Yull | 320/48 |
| 2,471,660 | 5/1949 | Stelmack | 340/620 |
| 2,534,633 | 12/1950 | Smith | 340/521 |
| 3,366,943 | 1/1968 | Hart | 340/636 |
| 3,462,353 | 8/1969 | Every et al. | 204/292 X |
| 3,508,973 | 4/1970 | Hicks et al. | 340/636 X |
| 3,600,234 | 8/1971 | Massie, Jr. | 340/636 X |
| 3,996,579 | 12/1976 | Dahl | 340/636 |
| 4,124,739 | 11/1978 | Sudworth | 429/61 |
| 4,388,584 | 6/1983 | Dahl et al. | 320/48 |

FOREIGN PATENT DOCUMENTS

| | | | |
|---|---|---|---|
| 2454410 | 5/1976 | Fed. Rep. of Germany | 320/48 |
| 790419 | 2/1958 | United Kingdom | 324/446 |

*Primary Examiner*—James L. Rowland
*Assistant Examiner*—Daniel Myer
*Attorney, Agent, or Firm*—Kenneth P. Glynn

[57] ABSTRACT

A wet cell battery monitor developed to monitor both electrolyte fluid level and electrolyte fluid charge (specific gravity) of a single cell. The monitor includes a probe and appropriate circuitry. The probe is adapted for insertion into a cell for monitoring and is connected to two circuits which are interconnected. Both include resistors, preferably variable, and include induction coil type relay switches. Blocking diodes are preferably used to maintain the independent integrity of each of the two circuit, one which warns of fluid level drop off and the other of a decrease in electrolyte fluid charge. The two circuits each drop off independenly in response to specific gravity (state of charge) and to fluid level, respectively, setting off alarms, e.g. visual or audio signals.

9 Claims, 3 Drawing Figures

EMERGENCY BATTERY CELL MONITOR

BACKGROUND OF THE INVENTION

1. Field of the Invention

The present invention relates to a novel improvement in battery monitors by which an individual cell of a wet cell battery may be monitored for variations in the state of charge of the electrolyte and electrolyte level. More specifically, it relates to a monitoring device which may be utilized in conjunction with emergency wet cell batteries already on location or in use for emergency backup power sources.

2. Description of the Prior Art

The prior art is replete with systems for remote indication of the specific gravity (state of charge) of battery electrolytes. For example, U.S. Pat. Nos. 4,124,739 and 3,508,973 typify this art. Specifically, when the state of charge of a given electrolyte drops below a certain level, a monitoring device sets off some sort of warning signal The prior art is likewise significant in the area of electrolyte level (fluid height) indicators. Thus U.S. Pat. Nos. 3,996,579; 3,366,943; 2,534,633 and 2,471,660 all describe systems for measuring battery electrolyte level drops wherein probes are inserted into one or more cells and when the level of fluid drops below the minimum acceptable level (predetermined depth of the probe) a circuit is completed so as to signal an alarm.

U.S. Pat. Nos. 4,388,584 and 3,600,234 both describe systems which monitor state of charge and electrolyte level. However, neither of these systems are designed to be portable units which may be moved from battery to battery as is the present invention. More significant, the devices rely upon either voltage regulation without the blocking diodes system of the present invention or more complicated systems involving transistor/zener diode combinations. Also in the present invention system a burden is placed on the battery that is being monitored since the present invention probe is used as a current carrier, unlike the prior art systems which are being used merely to check continuity or voltage.

There are some teachings in the prior art with respect to the use of tungsten carbide electrode accumulators and tungsten/platinum probes to create potential differences, such is taught in German Pat. No. 2,454,410 and British Pat. No. 790,419, respectively. But this prior art does not teach the use of a purely tungsten probe nor does it teach the use of such a probe in the context of the present invention as more fully described below.

Thus, notwithstanding the relatively close prior art in this particular field of technology, it is believed that the prior art neither teaches nor renders obvious the unique, dual purpose emergency wet cell battery monitor of the present invention.

SUMMARY OF THE INVENTION

The present invention is directed to a wet cell battery monitor developed to monitor both electrolyte fluid level and electrolyte fluid charge (specific gravity) of a single cell. The monitor includes a probe and appropriate circuitry. The probe is adapted for insertion into a cell for monitoring and is connected to two circuits which are interconnected. Both include resistors, preferably variable, and include induction coil type relay switches. Blocking diodes are preferably used to maintain the independent integrity of each of the two circuits, one which warns of fluid level drop off and the other of a decrease in electrolyte fluid charge.

DETAILED DESCRIPTION OF THE INVENTION AND DRAWINGS

It is well recognized that any wet cell battery will show a potential voltage reading as long as there is electrolyte surrounding a portion of the plates in each cell. For this reason, it is desirable to develop a more reliable system to measure battery condition than the present conventional system of monitoring the voltage of the battery. In order for a battery to perform to its specification, the plates in each individual cell must be fully surrounded by electrolyte fluid having a defined specific gravity. Poor performance will occur if the electrolyte level drops due to, for example, evaporation, boil off or leakage, or if the specific gravity or electrolyte concentration of the electrolyte fluid is changed, even though the total battery voltage remains constant. Boil off is sometimes caused by, for example, charging the battery. The batteries used in operation of emergency devices are constantly connected to a battery charger and a maintenance charge is placed on the battery virtually continuously to insure that the battery is always in a charged condition in case of an emergency. However, this is, in fact, not always the case, as during the charging there is boil off which normally occurs and the electrolyte may drop below the top of the plates and therefore decrease the capacity of the battery. It is also possible to have an undetected shorting of the plates in one or more of many cells, thereby causing a decrease in the state of charge in the defective cell or cells, which in turn decreases the capacity of the battery, and which ultimately could cause the emergency device to function improperly. The present invention was thus developed to enable distinctive and discriminating monitoring of a single cell for both electrolyte fluid level, and for charge.

Figure 1:
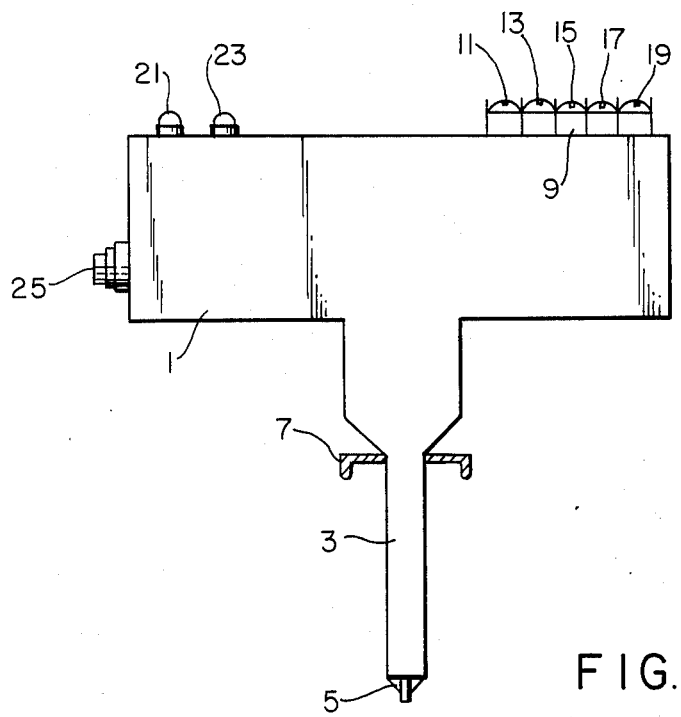
FIG. 1 illustrates a monitor of the present invention encased in plastic.

Referring now specifically to the drawings, FIG. 1 shows a side view of a present invention monitor 1, in one of its preferred embodiments. Monitor 1 has a molded acid proof (acid resistant) body as shown, including probe encasement 3 and probe 5. In this case, probe 5 is made of tungsten, the preferred metal for lead-acid cell monitoring. Optional seal flange 7 is shown cut. This flange 7 acts to seal the electrolyte fluid much like a conventional battery fill cap. This prevents losses, evaporation, spillage, etc. while the probe is in use. Terminal block 9 has dry contacts 11, 13, 15, 17 and 19 for normally closed, common, normally open, battery positive and battery negative terminals, respectively. Electrolyte fluid level indicator 23 and charge indicator 21 are also shown. These indicators may be visual, e.g. LED or lights, or may be audio, such as buzzer, horn, etc. Reset button 25 is shown and this is used to reset the internal circuitry after an indicator has gone off and an adjustment or correction is made, e.g. refilling a cell with electrolyte fluid.

Figure 2:
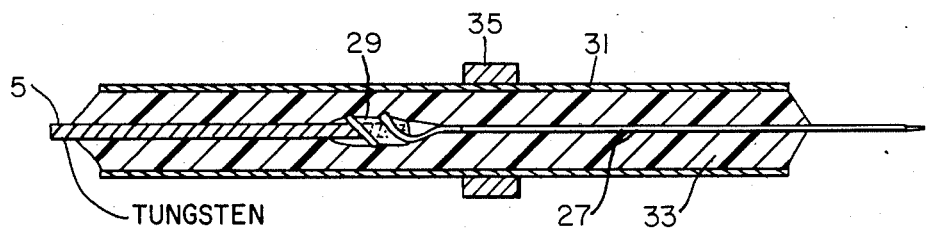
FIG. 2 shows a detailed sectional view of a preferred probe used in a monitor of the present invention; and, FIG. 3 shows a schematic diagram of the preferred circuitry and probe of a monitor of the present invention.

Turning now to FIG. 2, details of the probe are illustrated. The diameter or shape of the tungsten probe is of no consequence, as the actual material is what makes the battery monitor circuit function properly. It has been discovered that when tungsten is placed in a battery and makes contact with the electrolyte, the electrolyte will always be at a positive (+) potential with respect to the negative (−) terminal of the battery. In this circuit configuration, current will flow. The negative (−) battery post may thus become the reference point for all the cells. Should the reference point be changed to the positive (+) pole it was found that the device would not function properly, with or without blocking diodes included as a safety precaution. The tungsten probes when used with lead-acid type electrolyte will only pass current in one direction and with this discovery the disintegration and corrosion effect on the probe has been eliminated. With the elimination of the disintegration and corrosive effect on the probe a failsafe and effective battery monitor can be constructed which will alarm on any drop in specific gravity in the electrolyte as described herein.

FIG. 2 shows a preferred probe for the present invention which would be used for insertion in the cap of a conventional lead-acid battery or nickel-cadmium battery. The probe consists of a tungsten shaft 5, wire lead 27, shrinkable tubing 29, glass or plastic casing 31, plastic or silicon rubber filler 33, and insertion restricter 35. The restricter could have a cap configuration in the alternative such as is shown in FIG. 1. Construction of the probe is important, as the gases which are emitted from the battery are also corrosive and may seriously corrode all connections they come in contact with. The diameter of the tungsten wire is of no consequence as it is the actual material which makes the device function. The tungsten wire is attached to a wire lead 27 by making a few wraps around the tungsten and placing a piece of shrinkable tubing around the connection and applying heat. This makes for a good connection and adds to the sealing of the connection. The complete assembly is placed in a glass or plastic tube which is then filled with a filler 33 which can be silicon rubber or plastic or any substance which is not affected by acid. This filler is used to seal out the gases as well as the electrolyte, and for positioning and holding the tungsten probe 5 in place as it slightly protrudes past the glass casing 31. The optional insertion restrainer 35 may be used for setting the depth that the probe is inserted into the battery cell.

Now turning to the functional aspects of the present invention monitor, this will be described narratively and then in conjunction with the details of the preferred arrangement shown in FIG. 3.

The wet cell battery monitor of the present invention includes a conductive probe of the type described above, at least two circuits, at least two warning indicators, a terminal block and a reset means, e.g. a reset push-button. As mentioned, the conductive probe is adapted for insertion into a single cell of a wet cell battery to a predetermined depth, this depth corresponding to a minimum acceptable electrolyte fluid level contained within the cell. The conductive probe is adapted to function conductively when inserted into the cell when the electrolyte fluid level is at or above the minimum acceptable electrolyte fluid level and to function nonconductively when the electrolyte fluid level is below the minimum acceptable electrolyte fluid level.

There are at least two circuits contained within the present invention monitor. The first circuit is connectively related, i.e. directly or indirectly connected to, said probe and has a first resistor preferably adjustable or variable, set at a predetermined resistance, and has a relay induction coil switching means precalibrated to drop out in response to a decrease in the current from the electrolyte fluid through the probe, based on a predetermined minimum acceptable specific gravity (indicating a predetermined charge). A first warning means is connected to this first circuit to indicate that the drop out has occurred, i.e. the state of charge (specific gravity) of the electrolyte fluid has decreased below a minimum acceptable value.

A second circuit is connectively related to said first circuit (and therefore to said probe) and has a resistor, preferably variable, and a relay induction coil switching means precalibrated to drop out as a result of the probe changing from functioning conductively to functioning non-conductively, i.e. the probe indicating that the electrolyte fluid level has fallen below the predetermined minimum acceptable level, namely the liquid is below and no longer touching the tip of the probe in the cell. A second warning means is responsive to this change and so indicates.

Blocking diodes, e.g. two such diodes are included within the circuitry to add an element of safety, i.e. to assure that each of the circuits function independently and without interference.

Thus, the present invention comprises a monitor for monitoring electrolyte fluid level, and specific gravity or state of charge and voltage of the batteries that are used, for example, in the starting, controlling, or monitoring of emergency equipment such as stand-by generators, ground fault interrupters, fire and burglar alarms, substation switchgear, engine driven fire pumps and uninterruptable power supplies, as used for computers.

In monitoring any battery for its effectiveness in supplying power it would be preferable to place a burden on the battery that is being monitored. The present invention monitor does exactly that, as the probe is being used as a current carrier, unlike the prior art systems which are being used merely to check continuity or voltage.

Typical wet cell batteries have a positive (+) and negative (−) terminal and comprise any number of individual cells as, for example, six cells. Each cell may individually be probed with the monitor of the present invention wherein the probe is extended a predetermined fixed distance into the liquid electrolyte of the tested cell to a point above the plates, which corresponds to the lowest acceptable operating electrolyte level for the cell.

The probe, as mentioned, may be mounted in detachable battery caps as are found, for example, in the conventional automobile battery, or the permanently affixed caps that are found in the "maintenance free" battery, or they may be molded integrally into a seal retainer of another design. The probe is preferably made of tungsten for use with the conventional lead acid (sulfuric) batteries and nickel cadmium batteries. When the probe is made of lead or other types of steel, the probe will eventually corrode and become useless through the corrosion and disintegration. When the tungsten probe is used, the probe itself will become polarized and will not function unless the negative battery terminal is used as the reference point as shown in the schematic, FIG. 3. Due to this feature, the present invention monitor virtually eliminates false alarms.

Figure 3:
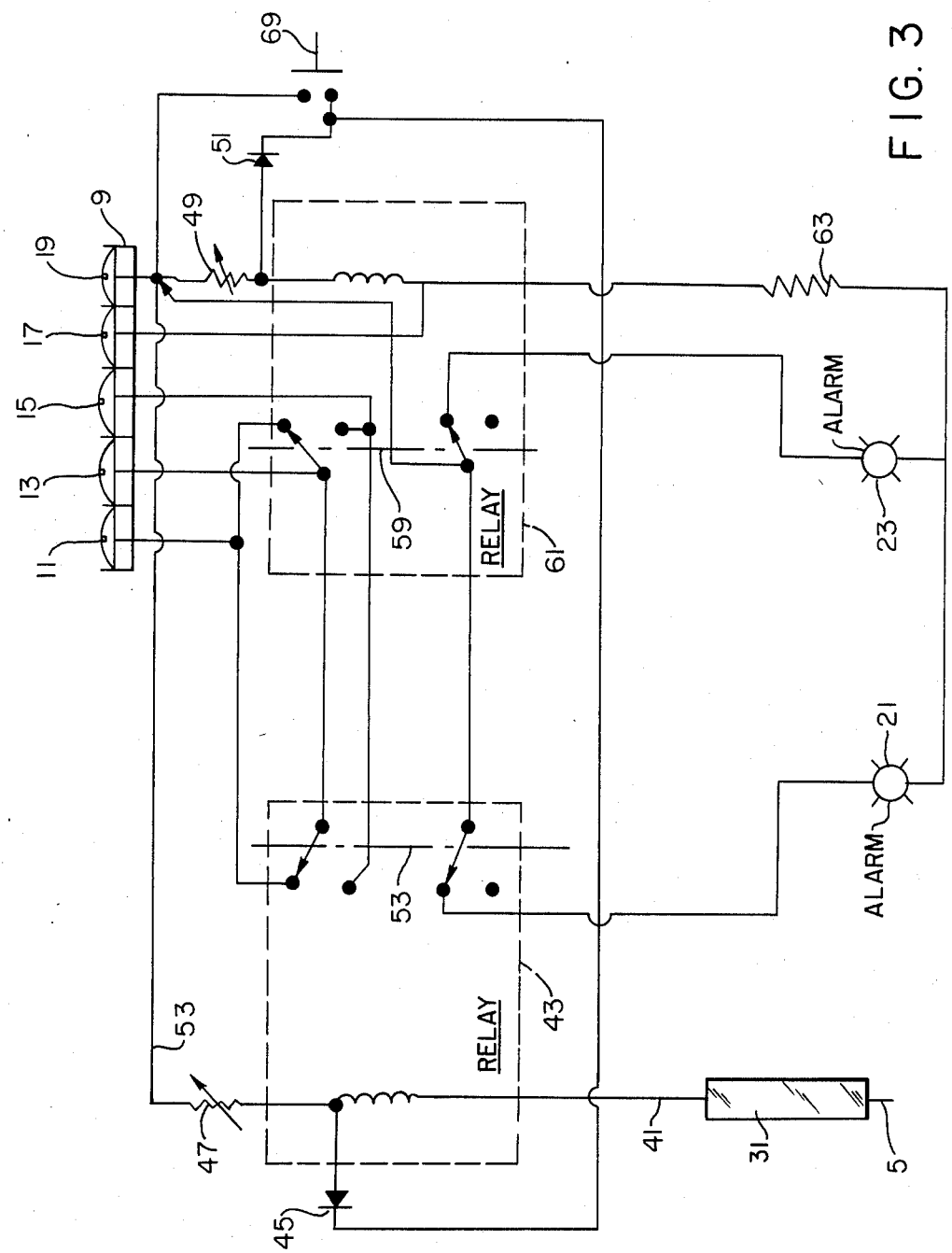

The circuitry now described in FIG. 3 is essentially that which is utilized in a FIG. 1 type present invention device, and actual connections from the contacts are not shown but are understood.

In FIG. 3, the probe 5 is encased in a casing 33 such as is shown in FIGS. 1 and 2 and is connected to wire 41 which is connected to the coil of relay 43 (shown enclosed by the dotted lines). As discussed above, in this invention, probe 5 will always be at positive voltage potential due to its tungsten construction. Wire 53 runs out of relay 43 through a calibrating resistor 47 which may be a fixed resistor but is preferably variable. Wire 53 then is connected to battery negative contact 19, push button reset switch 69 and via terminal block 9, to other leads, as shown. By being connected to the battery negative contact 19 (and thus the battery negative terminal, not shown), the negative terminal becomes the reference point for the state of charge (specific gravity) determination. Push button reset switch 69 is normally open and is used to reset the device after the device has gone into signalling an alarm (and a correction has been made). The negative voltage is always being controlled for calibration purposes, e.g. the negative voltage is dropped so as to set the drop-out point of relay 43, a full negative voltage is applied to relay 43 to pick up and assume the monitoring mode.

A second relay 61 is connected between the positive and negative battery terminals via contacts 17 and 19, as shown. Resistor 49 is variable and is used to adjust the drop out of this second relay 61, designed to determine battery charger failure i.e., state of charge. Battery charge pick-up calibrating resistor 63 may be variable or fixed depending upon the degree of control desired. This resistor 63 acts to adjust the pick up of relay 61.

Each of the two relays 61 and 43, respectively, drop out in response to predetermined state of charge and electrolyte level respectively causing signals 21 and 23 to alarm, respectively. Signals 21 and 23 may be visual or audio and may be buzzers or may be LEDs or even blinking lights. Each of the two relays 43 and 61 contain the necessary contact assemblies 53 and 59, as shown, respectively.

Blocking diode 45 is connected to relay 43 as shown and blocking diode 51 is connected to relay 61 as shown. These blocking diodes 45 and 51 assure that each of the circuits function independently and without interference. This enables precise discrimination between failure or warning of impending failure due to loss of electrolyte fluid versus loss of state of charge, inherently signalling which type of corrective action is necessary.

In the typical system having emergency batteries, there is a remote annunciator of some type. These monitors require a dry contact for activation. Hence, terminal block 9 contains dry contacts 11 (normally closed) 13 (common) and 15 (normally open). A dry contact is defined as a contact which does not have any voltage applied to it by the device in which it is located. In this case, the voltage would come from the power supply of the remote annunciator.

The foregoing examples have been presented merely to illustrate the present invention. Other variations should now be apparent to the artisan without exceeding the scope of the present invention.

What is claimed is:

1. A wet cell battery monitor for single cell monitoring of both electrolyte fluid level and electrolyte fluid charge, which comprises:

(a) a conductive probe adapted for insertion into a single cell of a wet cell battery to a predetermined depth, said predetermined depth corresponding to a minimum acceptable electrolyte fluid level contained within said single cell, said probe further adapted to function conductively when inserted when said electrolyte fluid level is at or above said minimum acceptable electrolyte fluid level and to function nonconductively when said electrolyte fluid level is below said minimum acceptable electrolyte fluid level;

(b) a first circuit connectively related to said probe, said first circuit having a first resistor of a predetermined resistance and having a relay induction coil switching means precalibrated to drop out in response to a decrease in the current from the electrolyte fluid through the probe, based on a predetermined minimum acceptable specific gravity of said electrolyte fluid;

(c) first warning means connected to said first circuit so as to indicate that said drop out has occurred, signifying a decrease of the electrolyte specific gravity below said predetermined minimum acceptable specific gravity;

(d) a second circuit connectively related to said first circuit, said second circuit having a second resistor of a predetermined resistance and a second relay induction coil switching means precalibrated to drop out in response to a change in the current from said probe from functioning conductively to functioning non-conductively as the result of said electrolyte fluid level falling below said minimum acceptable electrolyte fluid level;

(e) second warning means connected to said second circuit so as to indicate that said drop out has occurred, signifying an electrolyte fluid level below said minimum acceptable electrolyte fluid level;

(f) a blocking diode connected to at least one of said first and second circuits so as to assure independent and distinct functioning of each of said first and second circuits;

(g) a reset means electrically connected to said first and second circuits so as to enable the resetting of said switches after a drop out has occurred; and, (h) a terminal block connectively related to said first and second circuits so as to be capable of functional connection to said battery being monitored and to any power source desired.

2. The wet cell battery monitor of claim 1 wherein said warning means are visual means.

3. The wet cell battery monitor of claim 1 wherein said warning means are audio means.

4. The wet cell battery monitor of claim 1 wherein said probe is tungsten.

5. The wet cell battery monitor of claim 1 wherein at least one of said resistors is adjustable.

6. The wet cell battery monitor of claim 1 wherein said first and second circuits are encased in acid-resistant plastic.

7. The wet cell battery monitoring device of claim 6 wherein said probe is tungsten and said probe has an acid seal retainer adapted to cap off and seal the electrolyte fluid of a cell being tested.

8. The wet cell battery monitor of claim 1 wherein a resistor in said first circuit and a resistor in said second circuit are both adjustable.

9. The wet cell battery monitor of claim 1 wherein said warning means are visual warning means comprising blinking lights.

* * * * *